US007668970B2

(12) United States Patent
Blumrich et al.

(10) Patent No.: US 7,668,970 B2
(45) Date of Patent: *Feb. 23, 2010

(54) OPTIMIZED SCALABLE NETWORK SWITCH

(75) Inventors: Matthias A. Blumrich, Ridgefield, CT (US); Dong Chen, Croton on Hudson, NY (US); Paul W. Coteus, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 85 days.

This patent is subject to a terminal disclaimer.

(21) Appl. No.: 11/868,223

(22) Filed: Oct. 5, 2007

(65) Prior Publication Data

US 2008/0091842 A1 Apr. 17, 2008

Related U.S. Application Data

(63) Continuation of application No. 10/469,001, filed on Aug. 22, 2003, now Pat. No. 7,305,487.

(51) Int. Cl.
*G06F 15/173* (2006.01)
(52) U.S. Cl. .................. 709/238; 709/240; 709/220; 370/389; 370/392
(58) Field of Classification Search ......... 709/238–242, 709/220, 223–224, 200; 370/389, 392
See application file for complete search history.

(56) References Cited

U.S. PATENT DOCUMENTS 4,891,751 A    1/1990  Call et al.
5,175,733 A    12/1992 Nugent
5,181,017 A    1/1993  Frey et al.
5,347,450 A *  9/1994  Nugent ................... 709/243
5,408,676 A *  4/1995  Mori ...................... 712/16
5,598,408 A *  1/1997  Nickolls et al. ........... 370/351
5,737,628 A *  4/1998  Birrittella et al. ......... 712/11
5,822,604 A    10/1998 Ogasawara et al.
5,822,608 A *  10/1998 Dieffenderfer et al. ..... 712/11
5,892,923 A    4/1999  Yasuda et al.
5,928,351 A *  7/1999  Horie et al. ............... 712/11

FOREIGN PATENT DOCUMENTS

JP    H 08-251196    9/1996

* cited by examiner

*Primary Examiner*—Philip B Tran
(74) *Attorney, Agent, or Firm*—Scully, Scott, Murphy & Presser, P.C.; Daniel P. Morris, Esq.

(57) ABSTRACT

In a massively parallel computing system having a plurality of nodes configured in m multi-dimensions, each node including a computing device, a method for routing packets towards their destination nodes is provided which includes generating at least one of a 2m plurality of compact bit vectors containing information derived from downstream nodes. A multilevel arbitration process in which downstream information stored in the compact vectors, such as link status information and fullness of downstream buffers, is used to determine a preferred direction and virtual channel for packet transmission. Preferred direction ranges are encoded and virtual channels are selected by examining the plurality of compact bit vectors. This dynamic routing method eliminates the necessity of routing tables, thus enhancing scalability of the switch.

1 Claim, 5 Drawing Sheets

FIG. 2

| | LINK STATUS 201 | vc1 STATUS 202 | vc2 STATUS 203 | ESCAPE vc STATUS 204 | PRIORITY vc STATUS 205 |
|---|---|---|---|---|---|
| x+ OUTPUT STATUS BITS - 210 | 1 | 101 | 011 | 01 | 11 |
| x- OUTPUT STATUS BITS - 211 | 0 | 101 | 110 | 11 | 11 |
| y+ OUTPUT STATUS BITS - 212 | 1 | 011 | 110 | 11 | 11 |
| y- OUTPUT STATUS BITS - 213 | 0 | 101 | 110 | 11 | 11 |
| z+ OUTPUT STATUS BITS - 214 | 1 | 110 | 100 | 01 | 11 |
| z- OUTPUT STATUS BITS - 215 | 0 | 101 | 110 | 00 | 11 |

FIG. 3

| | vc1 STATUS 301 | vc2 STATUS 302 | ESCAPE vc STATUS 303 | PRIORITY vc STATUS 304 |
|---|---|---|---|---|
| x+ INPUT STATUS BITS - 310 | 101 | 111 | 111 | 000 |
| x- INPUT STATUS BITS - 311 | 101 | 110 | 111 | 000 |
| y+ INPUT STATUS BITS - 312 | 111 | 110 | 000 | 101 |
| y- INPUT STATUS BITS - 313 | 101 | 110 | 101 | 000 |
| z+ INPUT STATUS BITS - 314 | 110 | 100 | 110 | 000 |
| z- INPUT STATUS BITS - 315 | 101 | 110 | 000 | 000 |

| | INJECTION FIFO1 317 | INJECTION FIFO2 318 | INJECTION FIFO3 319 | INJECTION FIFO4 320 | INJECTION FIFO5 321 |
|---|---|---|---|---|---|
| INJECTION FIFO INPUT STATUS BITS - 316 | 101 | 101 | 110 | 000 | 000 |

FIG. 4

POSSIBLE BIT VECTOR

|  | vc1 | vc2 | ESCAPE vc | PRIORITY vc |
|---|---|---|---|---|
| x+ POSSIBLE BITS - 410 | 1 | 1 | 1 | 0 |
| x- POSSIBLE BITS - 411 | 0 | 0 | 0 | 0 |
| y+ POSSIBLE BITS - 412 | 0 | 0 | 0 | 0 |
| y- POSSIBLE BITS - 413 | 1 | 1 | 0 | 0 |
| z+ POSSIBLE BITS - 414 | 0 | 0 | 0 | 0 |
| z- POSSIBLE BITS - 415 | 0 | 0 | 0 | 0 |

| Type | vc | size | xhint | yhint | zhint | xdest | ydest | zdest | sequence | crc |
|---|---|---|---|---|---|---|---|---|---|---|
| 512 | 514 | 516 | 518 | 520 | 522 | 524 | 526 | 528 | 530 | 532 |

OPTIMIZED SCALABLE NETWORK SWITCH

CROSS-REFERENCE

This application is a continuation of U.S. application Ser. No. 10/469,001 filed on Aug. 22, 2003 now U.S. Pat. No. 7,305,487 which claims the benefit of commonly-owned, and co-pending U.S. Provisional Patent Application Ser. No. 60/271,124 filed Feb. 24, 2001 entitled MASSIVELY PARALLEL SUPERCOMPUTER, the whole contents and disclosure of which is expressly incorporated by reference herein as if fully set forth herein. This patent application is additionally related to the following commonly-owned, issued Patents and co-pending U.S. patent applications previously filed in the U.S. Patent and Trademark Office as indicated below, the entire contents and disclosure of each of which is expressly incorporated by reference herein as if fully set forth herein. U.S. Pat. No. 7,587,516 issued Sep. 8, 2009, for "Class Networking Routing"; U.S. patent application Ser. No. 10/469,000 filed Aug. 22, 2003, for "Global Tree Network for Computing Structures"; U.S. Pat. No. 7,444,385 issued Oct. 28, 2008, for "Global Interrupt and Barrier Networks"; U.S. Pat. No. 7,305,487 issued Dec. 4, 2007, for "Optimized Scalable Network Switch"; U.S. Pat. No. 7,313,582 issued Dec. 25, 2007, for "Arithmetic Functions in Toms and Tree Networks"; U.S. Pat. No. 7,418,068 issued Aug. 26, 2008, for "Data Capture Technique for High Speed Signaling"; U.S. patent application Ser. No. 10/468,995 filed Nov. 20, 2004, for "Managing Coherence Via Put/Get Windows"; U.S. Pat. No, 7,174,434 issued Feb. 6, 2007, for "Low Latency Memory Access And Synchronization"; U.S. Pat. No. 7,330,996 issued Feb. 12, 2008, for "Twin-Tailed Fail-Over for Fileservers Maintaining Full Performance in the Presence of Failure"; U.S. Pat. No. 7,210,088 issued April 24, 2007, for "Fault Isolation Through No-Overhead Link Level CRC"; U.S. patent application Ser. No. 10/469,003 filed Aug. 22, 2003, for "Ethernet Addressing Via Physical Location for Massively Parallel Systems"; U.S. Pat. No. 7,185,226 issued Feb. 27, 2005, for "Fault Tolerance in a Supercomputer Through Dynamic Repartitioning"; U.S. Pat. No. 6,895,416 issued May 17, 2007, for "Checkpointing Filesystem"; U.S. Pat. No. 7,315,877 issued Jan. 1, 2008, for "Efficient Implementation of Multidimensional Fast Fourier Transform on a Distributed-Memory Parallel Multi-Node Computer"; U.S. Pat. No. 7,555,566 issued Jun. 30, 2009, for "A Novel Massively Parallel Supercomputer"; and U.S. Pat. No. 6,592,449 issued Jul. 15, 2003, for "Smart Fan Modules and System".

STATEMENT OF GOVERNMENT INTEREST

This invention was made with Government support under subcontract number B517552 under prime contract number W-7405-ENG-48 awarded by the Department of Energy. The Government has certain rights in this invention.

FIELD OF THE INVENTION

The present invention broadly relates to a method of switching data traffic in a distributed-memory message-passing parallel computer. More particularly, it relates to a method that efficiently delivers error-free messages over an interconnection network in a massively parallel system.

BACKGROUND OF THE INVENTION

A well known topology for massively parallel computer data networking systems, is the 3D torus. a 3D torus is generally a cubic grid of compute nodes that has a ring network at every level. Supercomputing massively parallel systems, such as the system described in the Provisional Application Ser. No. 60/271,124, use the 3D torus topology to provide the minimal path route, i.e. the shortest path for communications between hundreds or thousands of nodes. One problem with this topology in a massively parallel system is the inefficient delivery of messages over an interconnection network, particularly when Ethernet or Asynchronous Transfer Mode (ATM) switches are used.

More specifically for example, Ethernet or ATM switches do not generally provide low latency, high throughput, and error free delivery of packets, since these switches typically lose packets if there is not enough buffer space, i.e., holding areas for input and output processing, to hold the packet. Additionally, the problem of contention, i.e., a conflict that arises when two or more requests are made concurrently for a resource that cannot be shared, such as a communication link, must be overcome if the switching network is to be scalable to the size of tens of thousands of nodes.

Typically, contention issues have been dealt with by employing some sort of arbitration algorithm which mediates which transmitters on a network can transmit packets subsequent to a packet collision detection. Unfortunately, the related art has not addressed the need for a collision detection/arbitration method which is ultra-scalable, thus suitable for massively parallel systems. Additionally, current routing techniques are not suitable for scaling up to massively parallel systems because the routers typically have tables that must be maintained. Overhead for table maintenance becomes unduly burdensome as the number of nodes reaches the tens of thousands.

As stated above, the three-dimensional (3D) torus topology is known. For example, the Cray T3E uses this 3D torus topology. However, the Cray uses routing tables stored in each switch element, an approach that does not scale well to tens of thousands of nodes. Other known technologies are the "Bubble" escape virtual channels (VC's), (Puente et al., "Adaptive Bubble Router: A Design to Balance Latency and Throughput in Networks for Parallel Computers", In Proceedings of the International Conference on Parallel Processing, ICPP '99, September 1999), which provide fully dynamic routing that does not require routing tables.

Another known technique is the use of multiple virtual channels to reduce "head-of-line" blocking, as employed in the SP2 and the Cray computers. The use of a two-stage arbitration approach has been taught by the MIT Reliable Router (William J. Dally, Larry R. Dennison, David Harris, Kinhong Kan, and Thucydides Xanthoppulos, "Architecture and Implementation of the Reliable Router," In Proceedings of HOT Interconnects II, pp. 122-133, August 1994).

Another related art technology uses virtual cut-through routing in an attempt to optimize throughput and latency. See P. Kermani and L. Kleinrock entitled "Virtual Cut-Through: A New Computer Communication Switching Technique", Computer Networks, Vol. 3, pp 267-286, 1979, incorporated herein by reference.

However, the related art references do not adequately solve the problem of packet contention and queueing delays along a selected packet direction of travel and virtual channel, particularly when a switch is scaled up to handle tens of thousands of nodes.

In a related disclosure, U.S. Provisional Application Ser. No. 60/271,124 entitled "A Novel Massively Parallel Supercomputer", therein is described a semiconductor device with two electronic processors within each node of the multicomputer. Within the supercomputer, there is a plurality of high-speed internal networks, and an external network employing Ethernet. These networks are expected to service over 64,000 nodes.

While there is no known prior art that attempts to scale a network switch to tens of thousands of nodes for fast, error-free operation, there remains the need for a scalable arbitration method that enables error-free, "low latency, high bandwidth (throughput) data communications, to enhance the message-passing capability for a massively parallel system.

SUMMARY OF THE INVENTION

Therefore, it is an object of the present invention to provide a method for arbitrating among packet transmitters, wherein latency is decreased, throughput is increased, and processing power has increased in a massively parallel system.

A further object of the present invention is to provide a method for preventing packet loss in the massively parallel system.

Yet another object of the current invention is to provide a method of data communications that avoids deadlocking users of the communications channels employed.

A further object of the current invention is to provide a method for increasing the probability of accurate packet reception.

Another object of the current invention is to provide the switch technology on the same chip as the processors, to facilitate scalability.

An even further object of the current invention is to provide a method for routing messages without using a routing table within the routers.

These and other objects and advantages may be obtained in the present invention by providing a multilevel arbitration method for decreasing latency, and increasing accurate packet reception in a massively parallel system.

Specifically, there is provided a packet routing method comprising; routing packets to their destinations by inputting packets from at least one of 2 m directions, (where m is an integer representing the dimensionality of the network), via at least one of a corresponding number of input links into a corresponding at least one of a plurality of virtual channel FIFO buffers; generating at least one of a 2 m plurality of output bit vectors containing information derived from downstream nodes; establishing a general arbitration policy wherein arbitration decisions are based on the link and downstream buffer fullness information contained in the output status bit vector; outputting, according to the general arbitration policy, the packets via multiple transfer paths to corresponding output links, wherein the packets are advanced towards their destination nodes.

BRIEF DESCRIPTION OF THE DRAWING

These and other features, and advantages of the present invention will become apparent to one skilled in the art, in view of the following detailed description taken in combination with attached drawings, with like reference numerals referring to like and corresponding elements, in which:

FIG. 2 shows an output status bit vector according to a preferred implementation of the present invention;

FIG. 3 shows an example of an input status bit vector according to a preferred implementation of the present invention;

FIG. 4 shows a "possible destination" bit vector according to a preferred implementation of the present invention;

FIG. 5 shows a packet header with hint bits according to a preferred implementation of the present invention.

DETAILED DESCRIPTION

Figure 1:
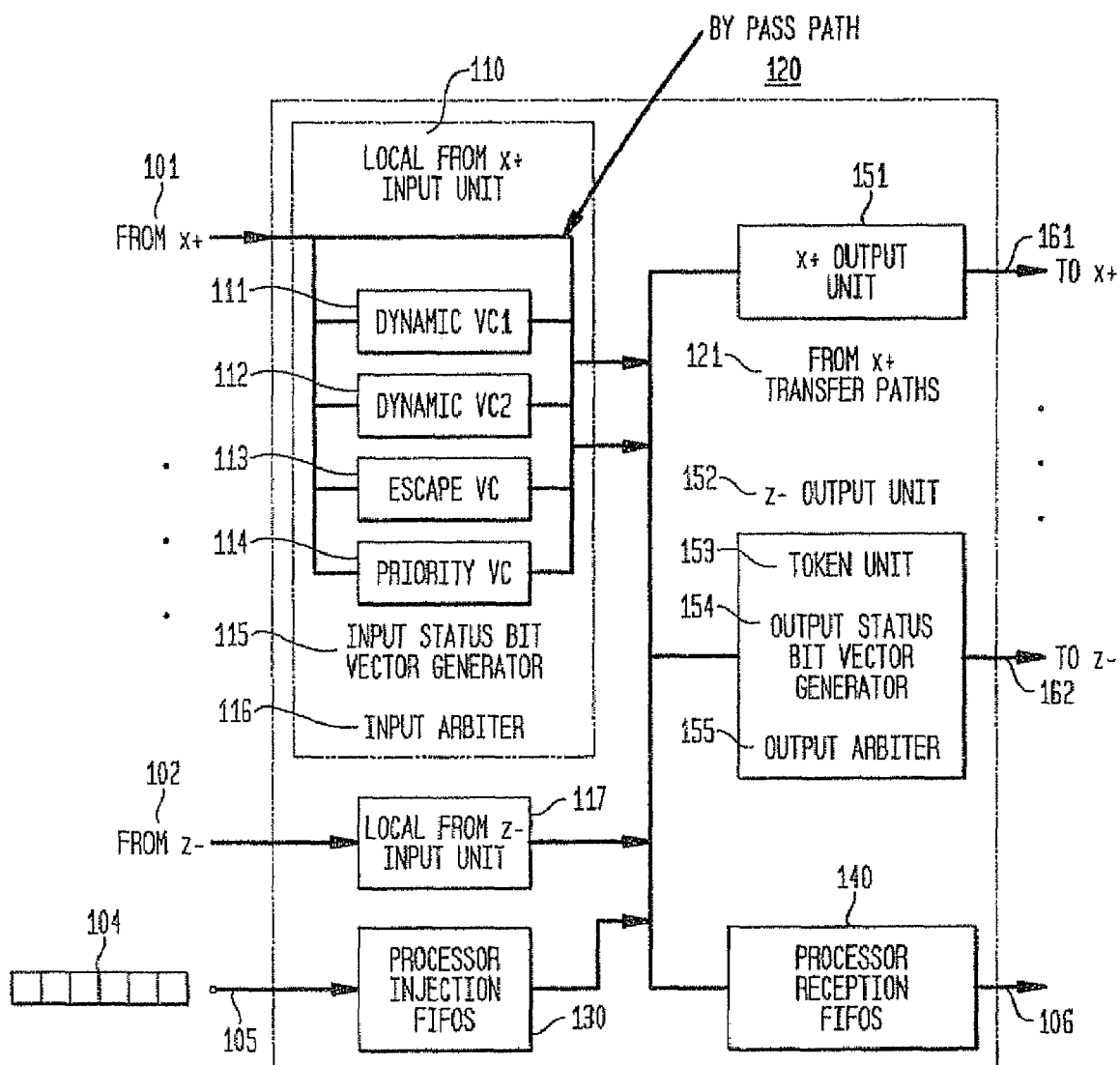
FIG. 1 shows the switch architecture according to a preferred implementation of the present invention.

The present invention will now be described in more detail by referring to the drawings that accompany the present application. This invention applies to network communication, i.e., message-passing among nodes in a three-dimensional torus network of a massively parallel computing system.

At the outset it should be noted that reference to "FIFO" (First in First Out) is used hereinafter interchangeably with the term "FIFO buffer" as are the plural "FIFO's" used interchangeably with the term "FIFO buffers". References to bit settings and bit counting sequences are exemplary only, and other bit settings, e.g., negative logic, and counting sequences, e.g., negative counting sequence to indicate positive increase in parameter or measurement are within the scope of this invention.

Figure 6:
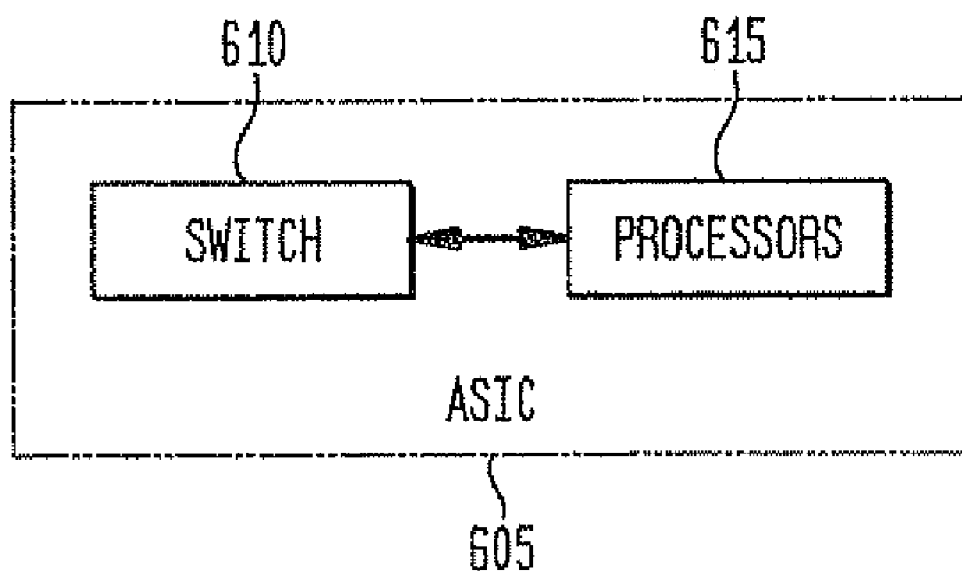
FIG. 6 shows an embodiment of the current invention, i.e., network switch, located on the same chip as the processor nodes.

According to a preferred implementation of this invention, the switch architecture, as shown in FIG. 1, which depicts an individual node in a network of processors such as a three dimensional torus network, may be implemented for all such nodes in the network. Additionally, referring to FIG. 6, it is shown that in a preferred implementation of the current invention, switch 610 may also be integrated onto the same chip 605 as the processors 615. The network delivers variable sized packets of data which, in a preferred implementation may be from one to eight 32 byte sized units, called "chunks". Each packet contains a descriptive packet header 510, as shown in FIG. 5. New, i.e., local packets 104, originating from a local node 105, enter the network via processor injection FIFO's 130 and are removed from the network upon reaching their destination by removing them from the processor reception FIFO's 140. In a preferred implementation of the current invention, there is at least one processor reception FIFO 140 dedicated to each input unit, such as 110, 117. Additionally, at least one processor reception FIFO 140 may be dedicated to high priority traffic.

Each node includes input links, one for each neighbor in the torus. FIG. 1, shows for example, the x+ input link 101 and the z– input link 102. Remaining input links, x–, y+, y–, z+ (not shown) represent an example of remaining directions of travel available to a global packet, i.e., a packet arriving from one of the input links, in a system such as the 3D torus system of the present invention. Corresponding to each input link is a local input arbiter such as the x+ input arbiter 116 which is included in x+ input unit 110. The x+ and z– input units 110, 117 are shown as exemplary structure.

Each node also includes output links such as link to the x+ direction 161, and link to the z– direction 162. As implemented in a preferred aspect of the current invention, there exists at least one output link for each neighbor in the torus. The output links are sourced by output units, such as the shown x+ and z– output units 151, 152. Within each output unit is an output arbiter such as the shown z– output arbiter 155.

The output units 151, 152 preferably contain the following sub-units:

A token unit counter 153 that counts how many chunks, i.e., tokens, are available to be stored at the downstream node. There is preferably one token unit counter for each direction and VC. When a packet wins arbitration, the token units coordinate with one another so that tokens are returned to the appropriate VC on the upstream node. This is accomplished by sending special, short, token messages.

An output status bit vector generator 154 that generates output status bits as shown in FIG. 2.

An output arbiter 155 that selects which packet, among all possible requesting packets, shall win control of the corresponding link.

An input unit, such as shown in input unit 110 comprises a cut-through, i.e., bypass path 120, and waiting buffers, i.e., FIFO's, one for each VC, for storing packets which are blocked, i.e., those packets which cannot move through the bypass path 120. Each FIFO can hold some maximum number of chunks. One or more "dynamic" VC's are implemented, such as dynamic VC's 111 and 112. The implementation of "escape" VC 113 for preventing deadlocks, and a high priority VC 114 is a known technique, as described in (Puente et al., "Adaptive Bubble Router: A Design to Balance Latency and Throughput in Networks for Parallel Computers, ", In Proceedings of the International Conference on Parallel Processing, ICPP '99, September 1999). Implementation of by-pass path 120 allows packets to be routed through the node without being stored in a buffer. However, if a packet in the by-pass path is blocked for any reason, it is transferred into the appropriate FIFO buffer (i.e., the buffer corresponding to the VC associated with the packet). To prevent priority packets from over-taking one another, a priority packet in the bypass path is considered blocked if the corresponding priority VC FIFO is non-empty. Similarly, a normal priority packet that is not dynamically routable is considered blocked if the corresponding escape VC FIFO is non-empty. Only the packet header needs to be received in the FIFO before being ready to arbitrate (provided the packet is at the head of the FIFO). An input arbiter, such as input arbiter 116 includes an input status bit vector generator 115, which generates status bits as shown in FIG. 3 and which will be described later.

The input arbiter 116 provides dynamic routing by selecting which packet in the input arbiter gets priority, and which output direction and VC to request (or which processor reception FIFO to request if the packet has reached its destination). According to a preferred aspect of the present invention, once a packet wins input and output arbitration, i.e., gets priority for transfer to the output unit or processor reception FIFO's, it is transferred to the output link, or reception FIFO via one of a plurality of transfer paths 121. Unlike prior art switches in torus networks which have only a single such path, the plurality of transfer paths 121 enable a packet to be transferred even though one or more of them are being used. According to one aspect of the current invention, some of the transfer paths may be reserved exclusively for the reception FIFO's.

Additionally, a preferred aspect of the present invention includes a by-pass path 120. Associated with each packet at the head of FIFO, or in the by-pass path 120, is a bit vector of possible destination VC's and directions in which the packet may move. An example of such a bit vector 410-415 is shown in FIG. 4.

Output Status Bits

Each output arbiter is responsible for creating an output status bit vector that describes the availability of its link and the downstream buffer space (tokens) associated with this direction. FIG. 2 depicts a sample output status bit vector at an instant in time for the x+ 210 to z− 215 links. Each output status bit vector preferably contains a link status bit 201 indication whether the link is available (1) or not (0). As the link may also be used to exchange control messages related to the availability of tokens and/or acknowledgement of successfully received packet, such control messages receive absolute priority over data packets. Thus if such a control message is waiting to use the link, or is actually using the link, the link status bit is set to 0 and the control message is transmitted as soon as the physical link becomes free.

Status bits 202, 203 for each dynamic VC. The left-most bit indicates whether or not there are sufficient tokens downstream to store the largest sized packet. The other 2 bits are determined as follows. The available downstream tokens are broken up into 4 ranges defined by thresholds, e.g., $M>=T1>T2>T3>0$ where M is the maximum number of tokens. If the number of tokens available is t, then the bit vector is: 00 if $M>=t>T1$, 01 if $T1>=t>T2$, 10 if $T2>=t>T3$, and 11 if $T3>=t>0$. (Thus, the bit vector is smaller if more tokens are available. It should be understood to anyone skilled in the art that there exists a generalization to $k>2$ bits defining $2^k$ ranges). Status bits for the escape 204 and priority 205 VC. These bits follow the "bubble insertion" rules.

For the escape 204 and priority 205 status fields, the left bit is 1 if a new packet can be injected into the VC (this requires at least 2 full packet's worth of tokens) and the right bit is 1 if a packet already on the VC can continue (at least 1 fill packet's worth of tokens). (To prevent deadlocks, the "size" of all packets entering or on these VC's is considered to be the maximum packet size.)

For example, as shown in FIG. 2, in the x+ direction 210, the link is free, tokens are available at level 01 on VC 1, no tokens are available on VC 2, the escape VC does not have space to insert a new packet but does have space to forward a packet already "in the bubble", and the high priority VC can both insert and forward a packet.

Input Status Bits

Each input unit is responsible for creating an input status bit vector that describes the input fullness of its buffers for each VC associated with the direction associated with the input unit. FIG. 3 depicts sample status input bit vectors at an instant in time for the x+ 310 to z− 315 links. Each bit vector contains tree bits describing each VC 301-304. The left-most bit 301 is 1 if a packet is ready to arbitrate and 0 otherwise. The two right-most bits 303, 304 describe token fullness regions, i.e., if the FIFO contains b number of chunks, then the bits are 00 if $0<=b<T1$, 01 if $T1<=b<T2$, 10 if $T2<=b<T3$, and 11 if $T3<=b$ for thresholds T1, T2 and T3. It should be understood to anyone skilled in the art that ranges may be used to describe the number of packets, rather than chunks.

a. Each injection FIFO also has a similarly defined input status bit vector 316 as shown in FIG. 3 which illustrates input status bit vectors 317-321, indicating there are 5 injection FIFO's.

Possible Bit Vector

For each packet at the head of a FIFO or on the by-pass path, a bit vector is created that indicates which directions and VC's a packet may move along, i.e., for a given packet, which directions are still routing goals for each virtual channel. FIG. 4 depicts the possible bit vector for a non-priority packet that can move in either the x+ or y− directions. A portion of the bit vector corresponds to each direction 410-415. In this example, the packet may move on either dynamic VC in both the x+ and y− directions. Since the packet is non-priority, the entries for the priority VC's are all 0. In this example, the escape direction is chosen according to the standard dimension order, i.e., first x, then y, ten z, so the escape VC is in the x+ direction. If the possible bit vector is all zeros, then the packet has reached its destination.

Packet Header

The format for the packet header 510 is shown in FIG. 5. In a preferred embodiment, the packet header 510 will be relatively short in order to minimize overhead, e.g., 8 bytes. In the header 510, the first field (e.g., 8 bits) indicates the packet type 512, e.g., normal or priority, and may include a bit indicating whether or not the packet may be routed dynamically, or along a fixed route. In a related patent application 15270, it is described how the packet type can encode "class routing" operations which can also be supported in the current invention with obvious minor modifications. The VC field 514 (e.g., 2 bits) indicates which VC the packet is on and the size field 516 (e.g., 3 bits) indicates the number of chunks in the packet. The use of such headers is standard, however, a preferred implementation of the current invention includes "hint bits" 520, 522, and 524, which reduce latency by permitting the arbiter to begin selecting a direction earlier than would otherwise be possible. In a preferred implementation of the current invention, these hint bits are 2 bits/dimension and encode which directions are feasible for a packet to move in, e.g., if the x hint bits 518 are "00" then no more packet movement in the x direction is necessary, if the x hint bits 518 are "01" then the packet may move in the x+ direction, and if the x hint bits 518 are "10" then the packet may move in the x− direction. The hint bits must precede the destination fields 524, 526, and 528, and may, alternatively, precede the VC and size fields 514, 516. On a large parallel machine, e.g., a 64×32×32 node torus, the destination fields must be at least 6 bits each. Without the hint bits, 18 bits of destination address would have to be received before arbitration can begin. Thus, since the hint bits precede the destination bits, the hint bits advantageously allow the starting of the arbitration process before the entire packet header is read, i.e., before the destination bits are read, thereby reducing latency. As a packet is routed through the network, the hint bits need to be updated. For minimal hop dynamic routing, for example, the x hint bits, need only be set to 00 as the packet reaches the x coordinate of its destination. A preferred implementation of the current invention accomplishes this by including a register associated with each output link. Within the register is provided the relevant, e.g., the x coordinate of the downstream node. When the packet wins arbitration, the register can be compared with the destination's relevant coordinate; the hint bits are set to 00 if the value in the register and the destination's relevant coordinate are equal. Additionally, as is known in the art, for reliable messaging, the header may include a sequence number, as for example, in the known High Performance Parallel Interface (HIPPI) protocol, and a CRC to ensure that a header is correctly received.

Input/Output Arbitration

In a preferred implementation of the current invention, the arbitration process comprises two phases. First, each input unit selects which packet from among its ready-to-move packets (those at the head of a FIFO or on the by-pass path) will attempt to obtain a link (or reception FIFO). These selected packets are called "input winners". in addition to selecting the input winners, i.e., candidates, a direction for each candidate and VC for each candidate are selected for the next step in the arbitration. Both input and output arbitration is multilevel, i.e., separate arbitration processing is provided for packets arriving from each node direction to increase throughput of the packets in the system. Packet contention is reduced by the general arbitration policy as described by the rules employed in a preferred implementation of this invention.

Input Arbitration Phase:

A method provided by a preferred implementation of the current invention to select the input winners includes steps to determine which packets not at their destination are completely blocked, i.e., which packets have no links and VC's available in directions the packet needs to move, or no transfer path is available. These steps also determine which candidate packets are unblocked. In one aspect of the current invention the above steps are determined by performing an appropriate logical AND operation of the possible bit vectors 410-415 with the output status bit vectors 210-215. Similarly packets that have reached their destination may be determined to be blocked if there is no space in its reception FIFO or an unblocked candidate vector. Each unblocked candidate is assigned an input priority as follows. Two types of arbitration cycles, a random cycle or a longest queue cycle are provided by a preferred implementation of the current invention. A predefined arbitration cycle criteria of the switch determines what fraction of the arbitration cycles are random. On a random cycle, each candidate packet in a non-priority VC buffer is assigned a random (or based on a round robin algorithm) 2 bit vector. On a longest queue cycle these candidate packets are assigned a priority equal to the right two input status bits. The priorities so generated are used in an overall priority scheme as follows (from highest priority to lowest):

The unblocked candidate packet at the head of the priority VC.

The unblocked candidate packet in the by-pass path, if it is a high priority packet and there are no packets in the high priority VC buffer.

The unblocked candidate packet in a non-priority VC buffer having the highest 2 bit priority vector (ties broken by an arbitrary mechanism, such as random or round robin)

The unblocked candidate packet in the by-pass path, provided it is a non-priority packet.

For non-priority packets, this algorithm tends to select packets at the head of the most full FIFO's. The winning candidate packet then selects its candidate direction and VC as follows.

If the packet is high priority it selects the direction and the priority VC for which the priority VC bit of the possible bit vector is set to 1.

If the packet is non-priority but not dynamically routable, it selects the direction and escape VC for which the escape VC bit of the possible bit vector is set to "1".

If the packet is non-priority and dynamically routable, it selects, from among those links and dynamic VC's that both are available and possible, the direction and dynamic VC having the smallest right 2 bits in the output status bit vector.

If no such link and dynamic VC exist, it selects the direction and escape VC for which the escape VC bit of the possible bit vector is set to "1".

The input winners then present their candidate direction and VC to the corresponding output arbiter if the destination is not the current node, or the reception FIFO if the destination is the current node. Each output arbiter/reception FIFO then selects a packet for output from among the presented input winners.

Output Arbitration Phase:

Each output arbiter is presented with a set of candidate input winners. In addition, there may be candidate packets from the injection FIFO's. Output arbitration also has two kinds of cycles: one in which packets from the injection FIFO's have low priority, and one in which packets from the injection FIFO's have high priority. A predefined output phase arbitration cycle criteria, e.g., a parameter of the switch, determines what fraction of cycles are of each type. If injection FIFO's have low priority on this cycle, the output arbiter selects its winner from among all its candidates as follows (highest to lowest priority). Ties are preferably broken randomly.

A high priority winning packet from an input unit that has the highest priority as indicated by the 2-bit status vectors.

A high priority packet from an injection queue with the highest 2-bit status vector.

A normal priority winning packet from an input unit that has the highest 2-bit status vector.

A normal priority from an injection FIFO that has the highest 2-bit status vector.

If injection packets have high priority on this cycle, the output arbiter preferably selects its winner from among all candidates as follows (highest to lowest priority):

A high priority packet from an injection queue with the highest 2-bit status vector.

A high priority winning packet from an input unit that has the highest priority as indicated by the 2-bit status vectors.

A normal priority from an injection FIFO that has the highest 2-bit status vector.

A normal priority winning packet from an input unit that has the highest 2-bit status vector.

Injection Arbitration

Candidate packets at the head of injection FIFO's select their candidate direction and VC in the same manner as the winning input candidate packets. These packets also carry a 2 bit status vector, either randomly generated or using the 2 bits to indicate the length of the injection FIFO.

Reception FIFO Arbitration

There may be one or more packets that need to be received at a switch node at the same time. To lessen contention, a separate reception FIFO is assigned to each incoming direction. In addition, there may be one or more FIFO's per direction. If there are multiple processors in each node then a preferable embodiment of the current invention allows for multiple FIFO's for each direction to enable each processor to have its own reception FIFO per direction. Bits in the packet header can be used to indicate which of these FIFO's, for a given direction, is to be used. Also, there may be one or more FIFO's set aside solely for use by high priority packets. If there is contention for these FIFO's, priority may be determined using the 2-bit status vectors.

Now that the invention has been described by way of a preferred embodiment, various modifications and improvements will occur to those of skill in the art. For example, it should be understood to anyone skilled in the art that alternate embodiments of this invention may include a single dimension, or may include m multi-dimensions, where m is any integer. Thus, it should be understood that the preferred embodiment is provided as an example and not as a limitation. The scope of the invention is defined by the appended claims.

What we claim is:

1. An integrated circuit device for implementation in computing node of a massively parallel computing system comprising a plurality of computing nodes configured in m multi-dimensions, said integrated circuit device comprising:

one or more computing devices; and, a virtual cut through network switch, operably connected with each said one or more computing devices for dynamically routing packets towards their destination nodes, said virtual cut through network switch comprising:

a) at least one input unit for inputting said packets from at least one of 2 m directions via at least one of a corresponding number of input links into a corresponding at least one of a plurality of virtual channels, each said packet comprising a packet header including one or more packet hint bits for indicating which of said 2 m directions are feasible for each of said packets to move in;

b) at least one input link for inputting local packets from a local of said nodes to at least one of a plurality of processor injection FIFO's;

c) an output status bit vector generator for generating a 2 m plurality of output status bit vectors, each of said output status bit vectors describing the availability of each said destination node's link, the availability of downstream dynamic virtual channels, and a downstream buffer space indication for all virtual channels associated with a downstream buffer space's direction;

d) an input arbiter and an output arbiter for establishing a general arbitration policy wherein arbitration decisions are made based on a content of said 2 m plurality of output status bit vectors;

e) at least one output link for outputting according to said general arbitration policy said packets via at least one transfer path to corresponding output links, wherein said packets are advanced towards said destination nodes, wherein said network switch for routing packets using hint bits from packet headers of said packets allows establishing said general arbitration policy to complete more quickly.

* * * * *